(12) United States Patent
Jiang et al.

(10) Patent No.: US 10,952,344 B1
(45) Date of Patent: Mar. 16, 2021

(54) RACK POWER DISTRIBUTION UNIT HAVING INTERCHANGEABLE OUTLETS

(71) Applicant: SCHNEIDER ELECTRIC IT CORPORATION, West Kingston, RI (US)

(72) Inventors: Yuchun Jiang, Saint Peters, MO (US); Daniel J. Rohr, Wildwood, MO (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 16/776,071

(22) Filed: Jan. 29, 2020

(51) Int. Cl.
H05K 1/18 (2006.01)
G06F 1/18 (2006.01)
H05K 7/10 (2006.01)
H05K 7/14 (2006.01)
H05K 7/04 (2006.01)

(52) U.S. Cl.
CPC .............. H05K 7/10 (2013.01); G06F 1/189 (2013.01); H05K 1/181 (2013.01); H05K 7/04 (2013.01); H05K 7/1405 (2013.01); H05K 7/1492 (2013.01); H05K 2201/10106 (2013.01)

(58) Field of Classification Search
CPC .............................. G06F 1/189; H05K 7/1492
See application file for complete search history.

(56) References Cited

U.S. PATENT DOCUMENTS

| 6,250,956 | B1 * | 6/2001 | Pulizzi | H01R 13/743 |
| | | | | 439/535 |
| 6,782,617 | B2 * | 8/2004 | Pulizzi | H01R 13/743 |
| | | | | 29/825 |
| 8,038,454 | B2 * | 10/2011 | Jiang | H01R 25/003 |
| | | | | 439/106 |
| 8,052,437 | B2 * | 11/2011 | Jiang | H05K 7/1457 |
| | | | | 439/106 |
| D687,778 | S * | 8/2013 | Utz | D13/133 |
| 8,587,950 | B2 * | 11/2013 | Ewing | H05K 1/115 |
| | | | | 361/752 |
| 8,882,536 | B2 * | 11/2014 | Utz | H01R 24/76 |
| | | | | 439/536 |
| 9,419,416 | B2 * | 8/2016 | Ewing | H05K 1/115 |
| 10,505,325 | B2 * | 12/2019 | Duncan | H01R 25/006 |
| 10,547,145 | B2 * | 1/2020 | Bowen | H01R 13/6395 |

(Continued)

FOREIGN PATENT DOCUMENTS

| CN | 107369992 A | * | 11/2017 |
| CN | 108023220 A | * | 5/2018 |

Primary Examiner — Robert J Hoffberg
(74) Attorney, Agent, or Firm — Lando & Anastasi, LLP

(57) ABSTRACT

A rack power distribution unit (rPDU) includes a chassis having one or more cutouts formed therein. The rPDU further includes one or more outlet assemblies within the outlet cutout. The outlet assembly includes a body having a front and a back, with the front having an outer flange and at least one outlet receptacle. The back of the body is configured to be inserted within the outlet cutout. The outlet assembly further includes a neutral terminal, at least one live terminal, and a ground. The outlet assembly further includes a fastener configured to secure the outlet assembly to the chassis. The rPDU further includes one or more printed circuit boards configured to the be secured to the chassis. The printed circuit board includes a first connector configured to connect to the neutral terminal and a second connector configured to connect to the live terminal.

19 Claims, 8 Drawing Sheets

(56) References Cited

U.S. PATENT DOCUMENTS

| | | | |
|---|---|---|---|
| 2011/0223784 A1 | 9/2011 | Jiang et al. | |
| 2012/0262861 A1* | 10/2012 | Lin | H05K 7/1492 |
| | | | 361/679.02 |
| 2015/0056853 A1* | 2/2015 | Utz | H05K 7/1492 |
| | | | 439/536 |
| 2019/0115705 A1 | 4/2019 | Duncan et al. | |
| 2019/0319413 A1* | 10/2019 | Bhakta | H01R 25/003 |

* cited by examiner

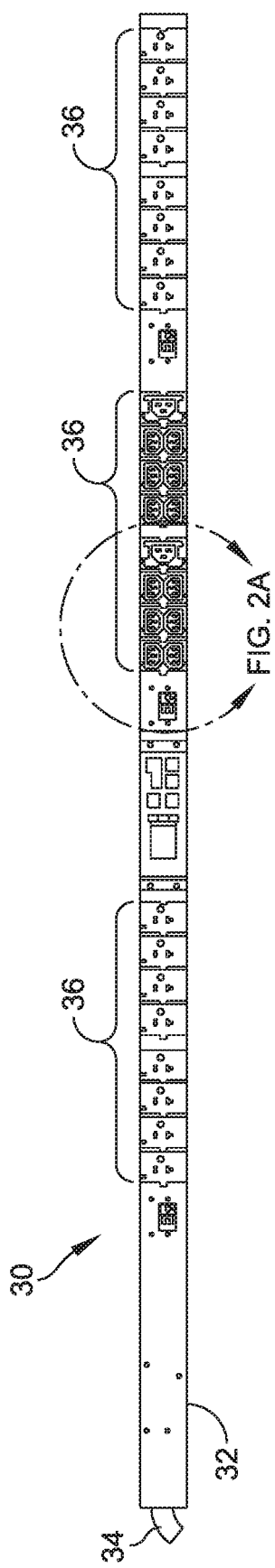
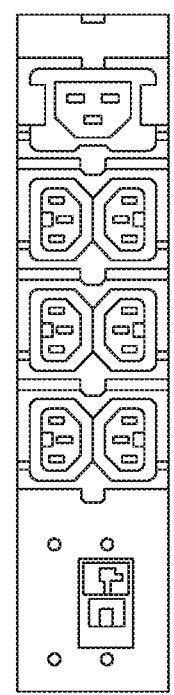
FIG. 2
FIG. 2A

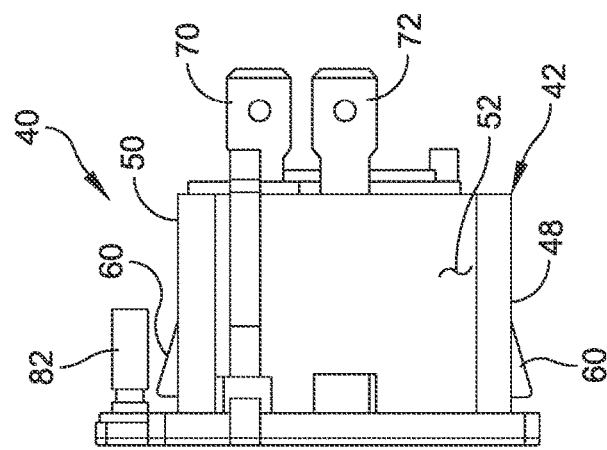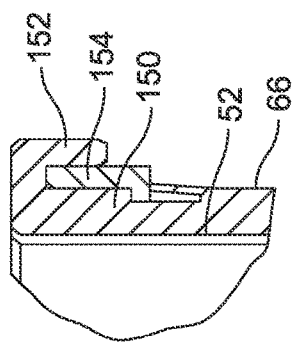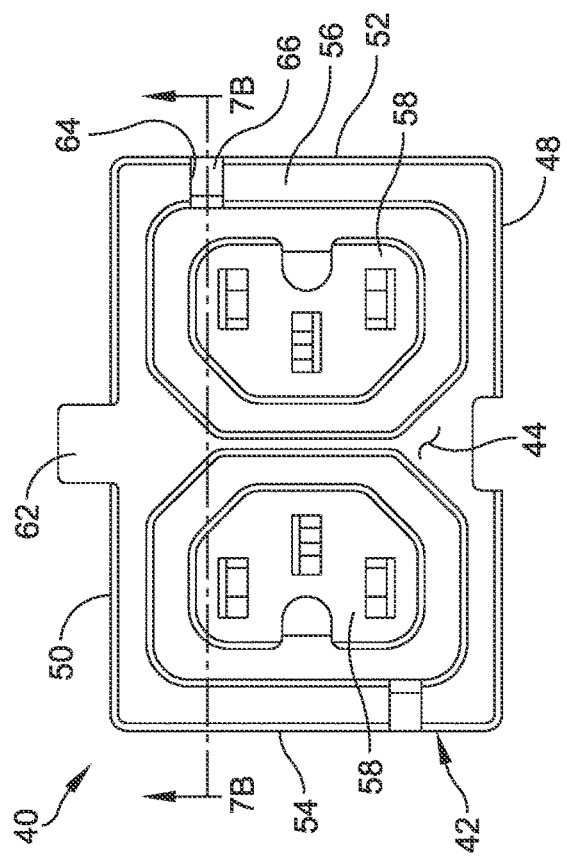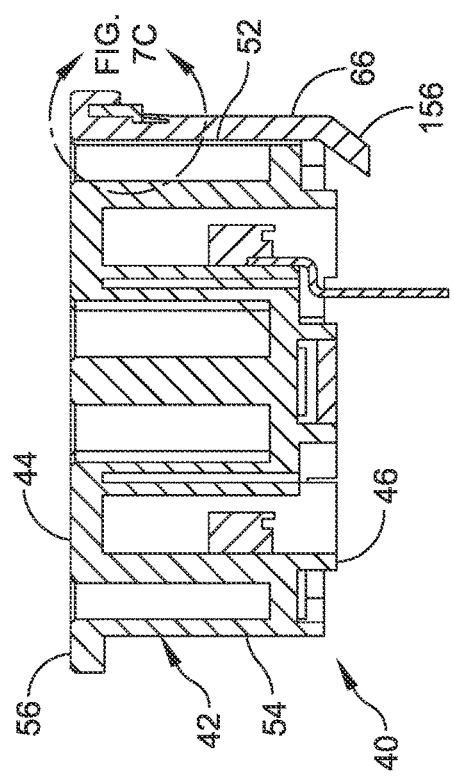

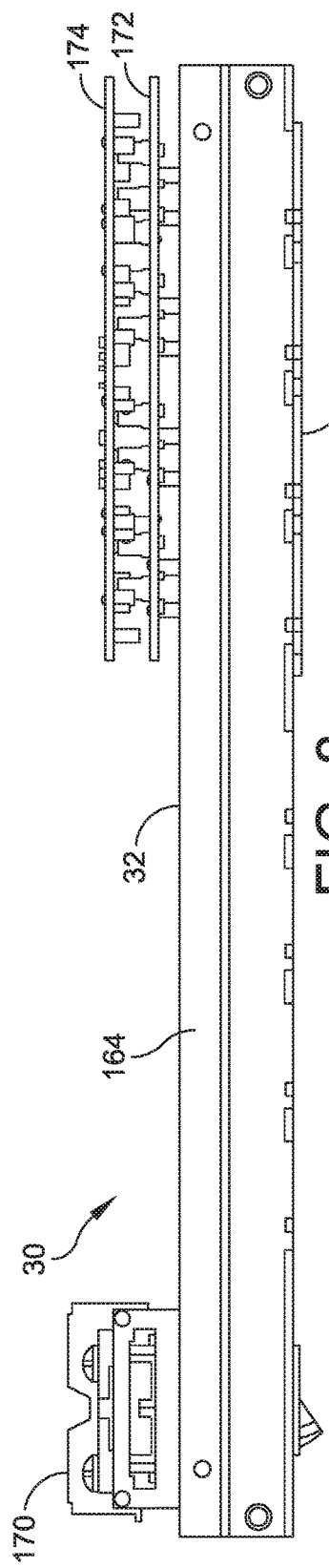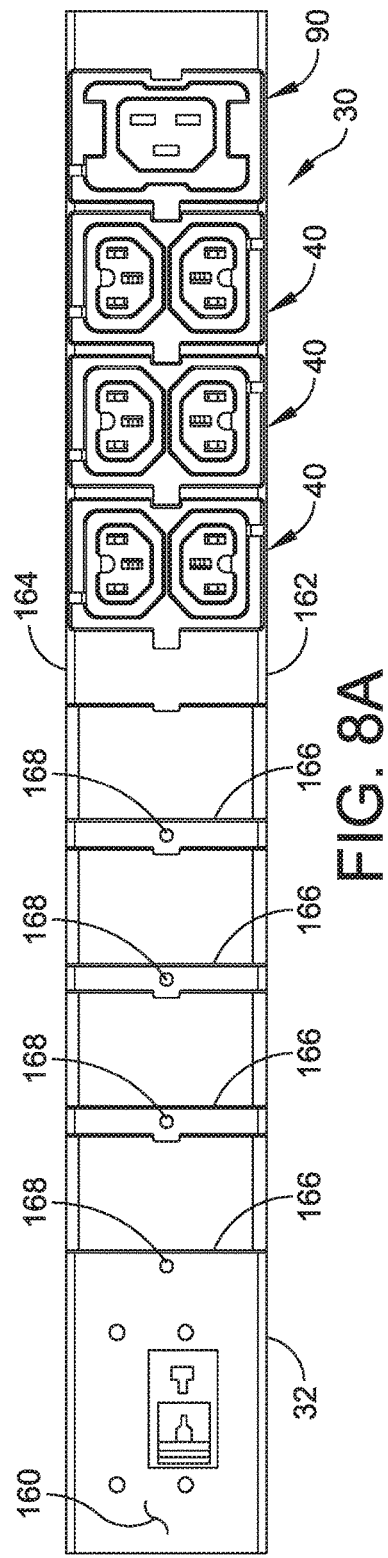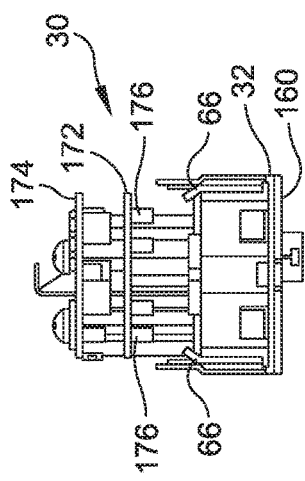
FIG. 8
FIG. 8A
FIG. 8B

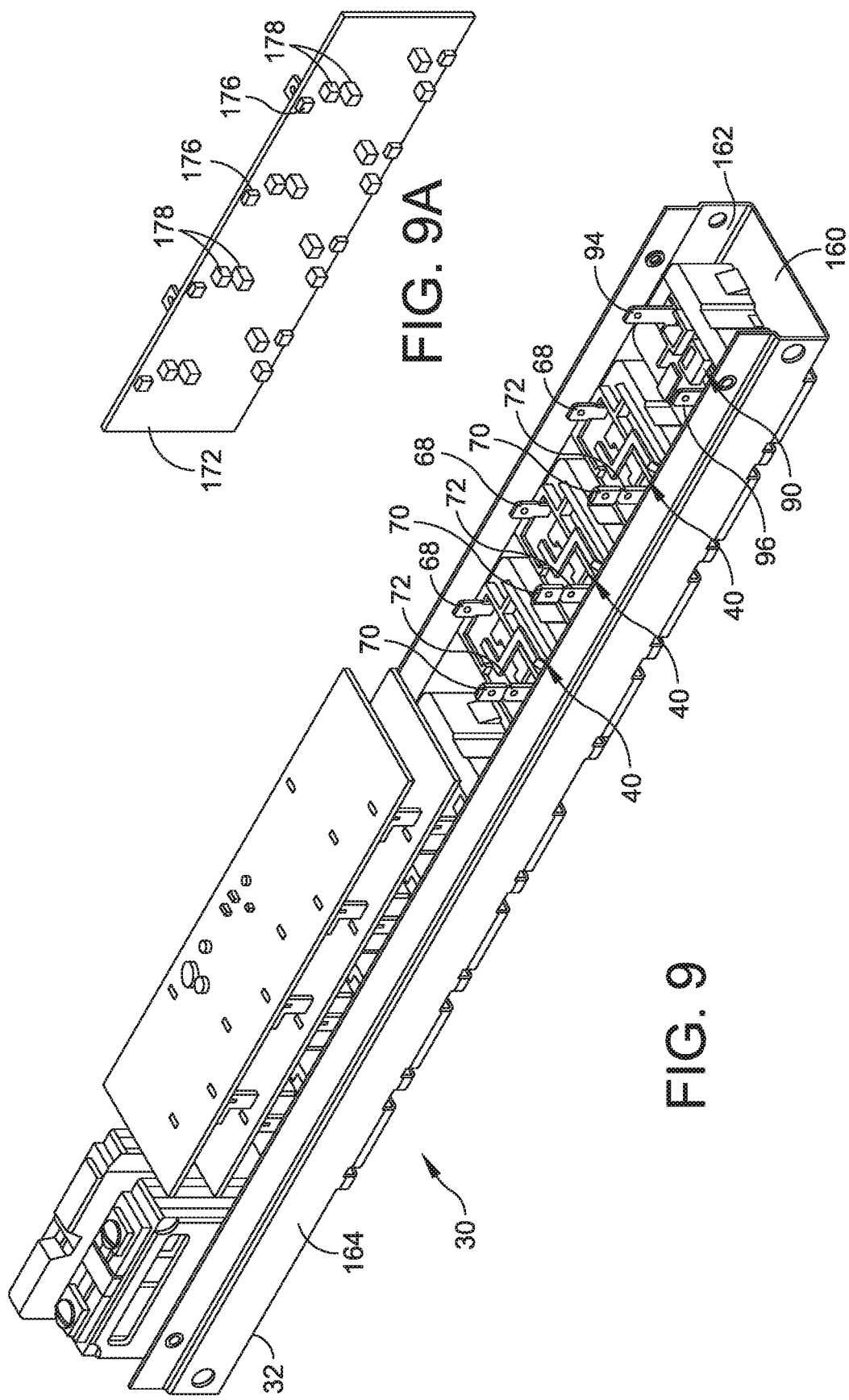

RACK POWER DISTRIBUTION UNIT HAVING INTERCHANGEABLE OUTLETS

BACKGROUND

1. Technical Field

Aspects and embodiments of the present invention are directed generally to electronic equipment mounting racks, and more specifically, to power distribution units having interchangeable outlets contained therein.

2. Discussion of Related Art

In response to the increasing demands of information-based economies, information technology networks continue to proliferate across the globe. One manifestation of this growth is the centralized network data center. A centralized network data center typically consists of various information technology equipment, co-located in a structure that provides network connectivity, electrical power, and cooling capacity. Often the equipment is housed in specialized enclosures termed "racks" which integrate these connectivity, power and cooling elements.

Equipment racks may include power distribution and wire management systems coupled to the racks to supply power and communication lines to the equipment in the racks. A type of power distribution system often used in electronic equipment racks, referred to as a "Rack Power Distribution Unit" or "rPDU," includes multiple electrical outlets of the same or different specification for supplying power to equipment in a rack. One or more rPDUs may be mounted, for example, on one or both sides of a front and/or a rear of an equipment rack.

SUMMARY

One aspect of the present disclosure is directed to a rack power distribution unit comprising a chassis including a front and a back. The front has at least one outlet cutout formed therein. The rack power distribution unit further comprises at least one outlet assembly within the at least one outlet cutout. The at least one outlet assembly includes a body having a front and a back. The front has an outer flange and at least one outlet receptacle. The back of the body is configured to be inserted within the at least one outlet cutout. The at least one outlet assembly further includes a neutral terminal, at least one live terminal, and a ground. The at least one outlet assembly further includes a fastener configured to secure the at least one outlet assembly to the chassis. The rack power distribution unit further comprises at least one printed circuit board configured to the be secured to the chassis. The at least one printed circuit board includes at least one first connector configured to connect to the neutral terminal and at least one second connector configured to connect to the at least one live terminal.

Embodiments of the rack power distribution unit further may include a ground terminal positioned along a side of the body of the at least one outlet assembly. The fastener may include a threaded portion forming part of the ground terminal and a threaded nut configured to be threadably received by the threaded portion. The chassis further may include a plurality of outlet cutouts, with each outlet cutout having a shape and size identical to other outlet cutouts. The chassis further may include a plurality of openings, with one opening for each outlet cutout with an opening being positioned adjacent a respective outlet cutout and configured to receive the fastener. The body of the at least one outlet assembly further may include a tab that extends horizontally from a side of the body along a plane parallel to a plane of the front of the body. The tab is configured to conceal the metal ground terminal. The printed circuit board may include at least one LED. The at least one outlet assembly further may include a light pipe secured to the body of the at least one outlet assembly. The light pipe may include an elongate element that travels along an end of the body of the outlet assembly and a hook element provided at a top of the elongate element, the hook element being configured to wrap around a hook retention feature of the body to enable the light pipe to snap in place when installed on the body of the at least one outlet assembly. The light pipe further may include a bent element provided at a bottom of the elongate element, with the bent element being configured to be located over an LED of the chassis when installing the at least one outlet assembly in the chassis. The light pipe may be made from clear plastic or glass to enable light from the LED to travel through the light pipe to illuminate the top of the at least one outlet assembly. The body of the at least one outlet assembly further may include at least one snap-in clip, which is configured to releasably engage an edge of the at least one outlet cutout to mount the body to the chassis. The at least one outlet assembly may include at least one of a C13 outlet, a C15 outlet, a C19 outlet, a C21 outlet, or a 5-20R outlet. The neutral terminal, the at least one live terminal and/or the ground terminal may vary in length.

Another aspect of the disclosure is directed to a rack power distribution unit comprising a chassis including a front and a back. The front has at least one outlet cutout formed therein. The rack power distribution unit further comprises at least one outlet assembly within the at least one outlet cutout. The at least one outlet assembly includes a body having a front and a back. The front has an outer flange and at least one outlet receptacle. The back of the body is configured to be inserted within the at least one outlet cutout. The at least one outlet assembly further includes a neutral terminal, at least one live terminal, and a ground. The rack power distribution unit further comprises at least one printed circuit board configured to the be secured to the chassis. The at least one printed circuit board includes at least one first connector configured to connect to the neutral terminal and at least one second connector configured to connect to the at least one live terminal. The at least one printed circuit board further includes at least one LED. The rack power distribution unit further includes a light pipe secured to the body of the at least one outlet assembly and positioned over the at least one LED so that light generated by the at least one LED travels through the light pipe.

Embodiments of the rack power distribution unit further may include configuring the light pipe to include an elongate element that travels along an end of the body of the at least one outlet assembly and a hook element provided at a top of the elongate element. The hook element may be configured to wrap around a hook retention feature of the body to enable the light pipe to snap in place when installed on the body of the at least one outlet assembly. The light pipe further may include a bent element provided at a bottom of the elongate element, with the bent element being configured to be located over an LED of the chassis when installing the at least one outlet assembly in the chassis. The light pipe may be made from clear plastic or glass to enable light from the LED to travel through the light pipe to illuminate the top of the at least one outlet assembly. The at least one outlet assembly may include at least one of a C13 outlet, a C15 outlet, a C19 outlet, a C21 outlet, or a 5-20R outlet. The neutral terminal, the at least one live terminal and/or the ground terminal may vary in length.

Yet another aspect of the disclosure is directed to a rack power distribution unit comprising a chassis including a front and a back. The front has at least one outlet cutout formed therein. The rack power distribution unit further comprises at least one outlet assembly within the at least one outlet cutout. The at least one outlet assembly includes a body having a front and a back. The front has an outer flange and at least one outlet receptacle. The back of the body is configured to be inserted within the at least one outlet cutout. The at least one outlet assembly further includes a neutral terminal, at least one live terminal, and a ground. The body of the at least one outlet assembly further includes at least one snap-in clip configured to releasably engage an edge of the outlet cutout to mount the body to the chassis. The rack power distribution unit further comprises at least one printed circuit board configured to the be secured to the chassis. The at least one printed circuit board includes at least one first connector configured to connect to the neutral terminal and at least one second connector configured to connect to the at least one live terminal.

Embodiments of the rack power distribution unit further may include a ground terminal positioned along a side of the body of the at least one outlet assembly, with the ground terminal including a threaded portion configured to be inserted into an opening of the chassis and secured by a threaded nut. The body of the at least one outlet assembly further may include a tab that extends horizontally from a side of the body along a plane parallel to a plane of the front of the body, with the tab being configured to conceal the metal ground terminal. The neutral terminal, the at least one live terminal and/or the ground terminal may vary in length.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 2 is a top plan view of a rack Power Distribution Unit (rPDU) having outlet assemblies of the present disclosure;

FIG. 2A is an enlarged top plan view of several outlet assemblies shown in FIG. 2;

FIG. 7 is a top plan view of the outlet assembly shown in FIGS. 5A and 5B;

FIG. 7A is a side view of the outlet assembly shown in FIG. 7;

FIG. 7B is a cross-sectional view of the outlet assembly taken along line 7B-7B in FIG. 7;

FIG. 7C is an enlarged detail view of a portion of the outlet assembly shown in FIG. 7B;

FIG. 8 is a side view of an rPDU of another embodiment having outlet assemblies of the present disclosure;

FIG. 8A is a top plan view of the rPDU shown in FIG. 8;

FIG. 8B is an end view of the rPDU shown in FIG. 8;

FIG. 9 is a back perspective view of the rPDU shown in FIG. 8 with printed circuit boards being positioned on a portion of the rPDU;

FIG. 9A is a perspective view of a back side of a printed circuit board shown in FIG. 9;

DETAILED DESCRIPTION

Embodiments of the present disclosure are directed generally to a rack Power Distribution Unit (rPDU) capable of providing power via outlets of the same or a different type arranged according to a desired configuration. The rPDU can be easily adapted to customer specifications identifying an arrangement of outlet types, and provides significant reductions in fabrication time, complexity, and cost.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Figure 1:
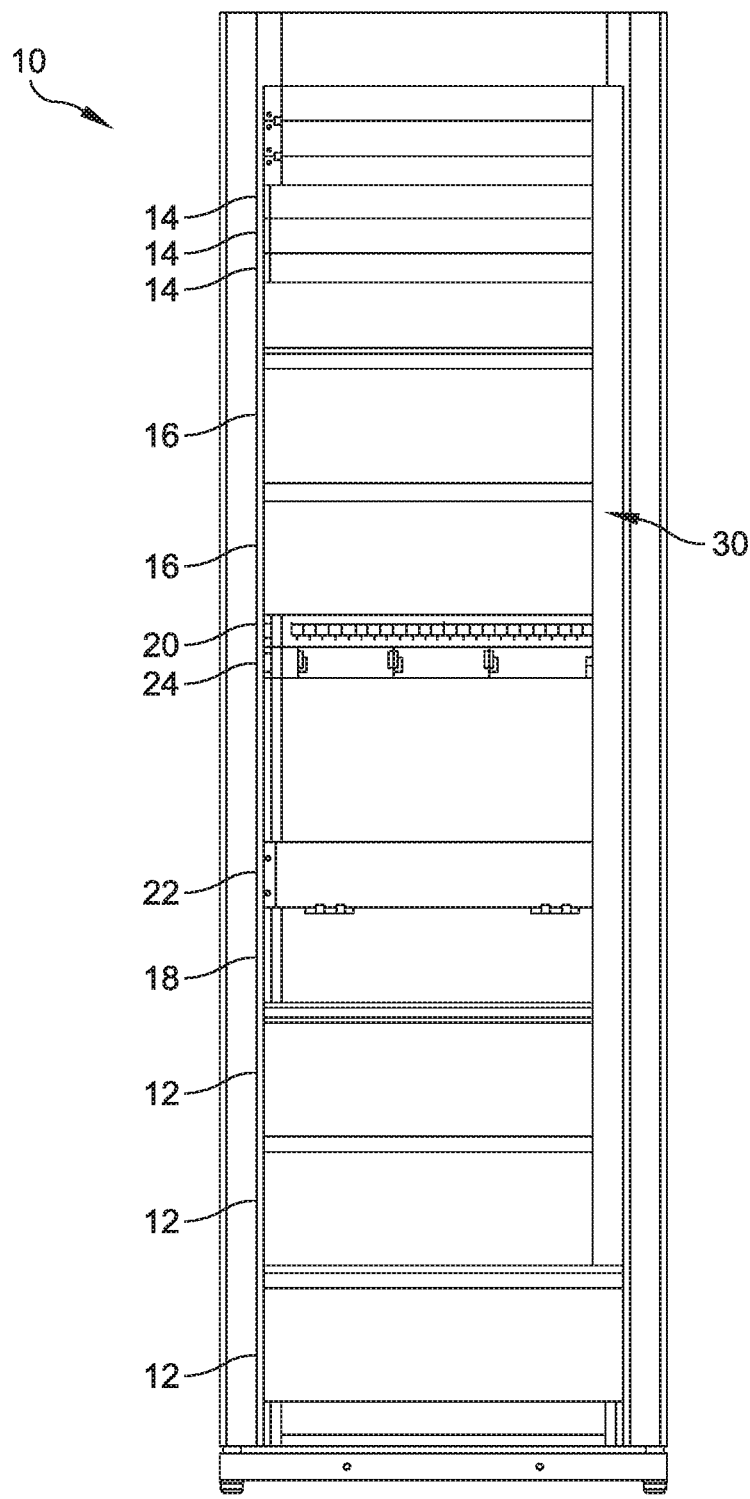
FIG. 1 is an elevational view of an electronic equipment rack.

A simplified rear view of an electronic equipment rack (also referred to herein simply as a "rack") is generally indicated at 10 in FIG. 1. The doors of the rack are omitted from FIG. 1 for clarity. The rack 10 may include drawer enclosures, each respectively indicated at 12, including items that support power and/or network connections for other equipment mounted in the rack. Uninterruptible Power Supplies (UPSs), each indicated at 14, may be installed as rack mounted devices to increase the power supply redundancy of the rack 10. The rack 10 may further include computing or network technology equipment, for example, one or more data storage devices, each indicated at 16, a server 18, a patch panel 20, a keyboard tray 22, a cable organizer 24, and/or a monitor or other user interface which may provide for an operator to communicate with the equipment in the rack. The rack 10 may be configured in any manner desired by the end user.

An rPDU, generally indicated at 30, may be mounted internal to the rack 10. The rPDU 30 may be vertically mounted, as illustrated in FIG. 1, or may be horizontally mounted in the rack 10 along with the other equipment in the rack. Although one rPDU 30 is shown and described, two or more rPDUs may be provided in the rack 10. The rPDU 30 may receive power from the UPS s 14 in the rack 10, or directly from an AC utility supply, and may include power outlets to which power cords from the various other equipment in the rack may be electrically connected.

The rPDU 30 may include outlets of a single type, or of varied types, configured to receive a plug of a corresponding type. As will be understood by one of ordinary skill in the art, International Electrotechnical Commission (IEC) 60320 defines a set of standards for general-purpose plug-and-outlet pairs. For example, the IEC 320-C19 standard identifies an outlet, which is typically employed in higher-current applications, such as in providing power to a UPS. Other types of outlets can be employed. For example, a C13 outlet is a common outlet used on personal computers and peripherals. A C15 outlet is used in high-temperature settings, for example, computer networking closets, and is a high-temperature variant of the C13 outlet. A C21 outlet is a high-temperature variant of the C19 outlet.

FIG. 2 illustrates one example of an rPDU 30 including outlets of varied types. The rPDU 30 includes an elongate rectangular chassis 32 having a plug 34 provided on an end of the chassis and several outlet banks each indicated at 36 provided on the frontside of the chassis. Each outlet bank 36 includes a total of eight outlets, which may include one or more type of outlet receptacle. For example, a first outlet bank 36 can be configured to include outlets of a first type of outlet receptacle and a second outlet bank can be configured to include outlets of a second type of outlet receptacle. In another example, each outlet bank can include outlets of a first type, outlets of a second type and so on. In normal operation, the rPDU 30 is configured to receive power via the plug 34 which is connected, for example, to an AC mains power supply or to a UPS, such as the UPS 14 provided in the rack 10. The power received via the plug 34 is distributed to each outlet in the outlet banks 36 to provide power to devices connected thereto.

Figure 3:
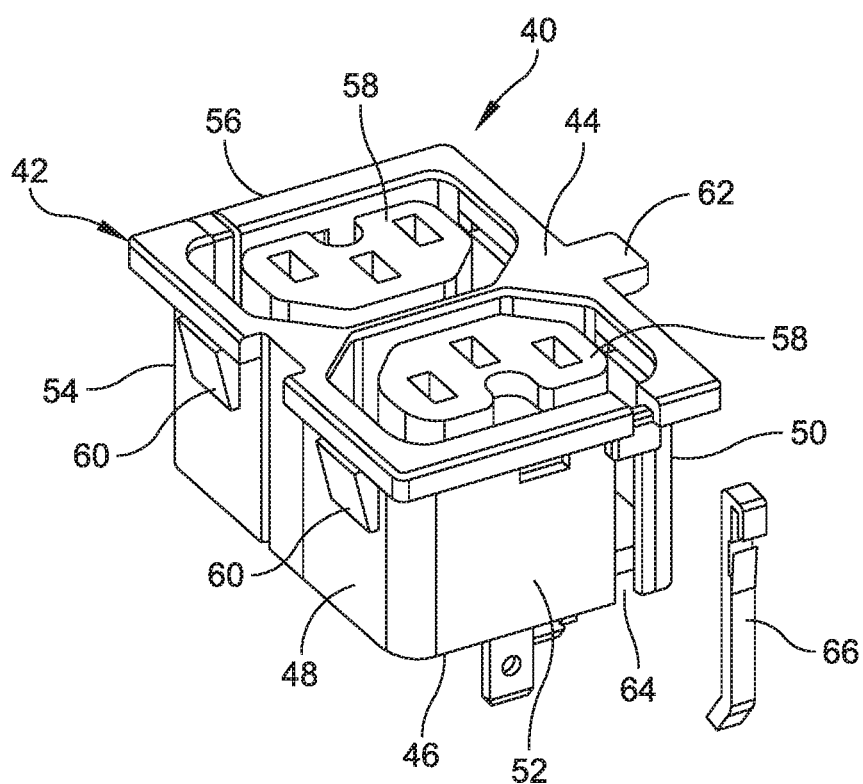
FIG. 3 is a perspective view of an outlet assembly shown in FIGS. 2 and 2A.

Referring to FIG. 3, an exemplary outlet assembly is generally indicated at 40. In the shown embodiment, the outlet assembly 40 is a dual C15 outlet, which is configured to receive a C16 plug. The C15 outlet is used in high-temperature settings, e.g., computer networking closets. The outlet assembly 40 includes a molded, plastic rectangular body generally indicated at 42, e.g., Nylon 6. The outlet body 42 of the outlet assembly 40 includes a front 44, a back 46, two sides 48, 50 and two ends 52, 54. The front 44 of the outlet body 42 includes an outer flange 56 and two outlet receptacles, each indicated at 58. The outer flange 56 is configured to have a height and width that is greater than the back 46 of the outlet body 42 to engage the chassis 32 of the rPDU 30 when installing the outlet assembly 40 within the chassis. The two outlet receptacles 58 are configured to each receive a plug. Side 48 and side 50 of the outlet body 42 of the outlet assembly 40 each include two snap-in clips, each indicated at 60, to mount the outlet body to the chassis 32 of the rPDU 30, which will be described in greater detail below. Side 50 of the outlet body 42 of the outlet assembly 40 further includes a tab 62 that extends horizontally from the side of the outlet body along a plane parallel to a plane of the front 44 of the outlet body. The tab 62 also conceals a fastener used to carry earth ground from the outlet body 42 to the chassis 32 to conceal a metal ground terminal. One end 52 of the outlet body 42 of the outlet assembly 40 further includes a feature 64 to receive a snap-in light pipe 66 fabricated from a clear material, such as a clear plastic or glass.

Figure 4A:
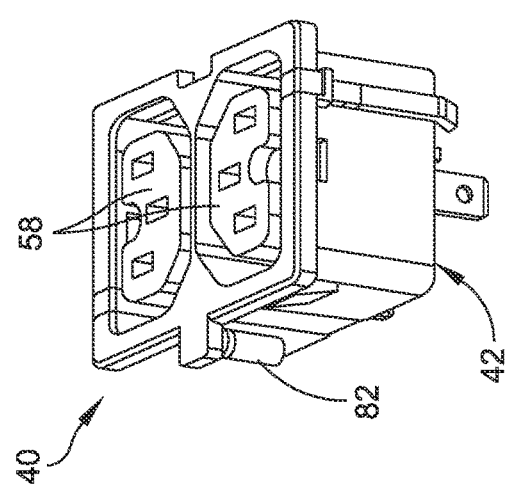
FIGS. 4A and 4B are top and bottom perspective views of an outlet assembly of an embodiment of the present disclosure.
Figure 4B:
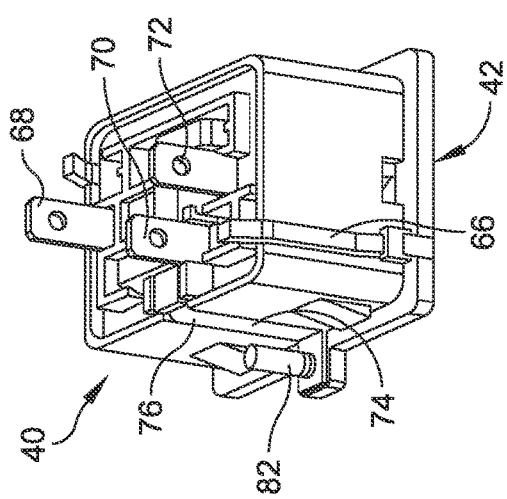

Referring to FIGS. 4A and 4B, which shows the outlet assembly 40 shown in FIG. 3, the outlet assembly 40 further includes a neutral terminal 68 that extends from the back 46 of the outlet body 42 adjacent an end of the outlet body. The outlet assembly 40 further includes two live terminals 70, 72 that extend from the back of the outlet body 42, with one live terminal 70 being positioned near a middle of the back of the outlet body and the other live terminal 72 being positioned adjacent an opposite end of the outlet body. The side 50 of the outlet body 42 includes a feature 74 to receive a ground terminal 76, which is configured to engage the chassis 32 of the rPDU 30 when the outlet body of the outlet assembly 40 is installed in the chassis of the rPDU. The ground terminal 76 is generally L-shaped in construction having one longer leg that runs along the side 50 of the outlet body 42 of the outlet assembly 40 within the feature 74 and a smaller leg that runs along an underside of the tab 62. The ground terminal 76 includes a threaded portion 82 that is used to secure the outlet assembly 40 to the chassis 32 of the rPDU 30.

Figure 5A:
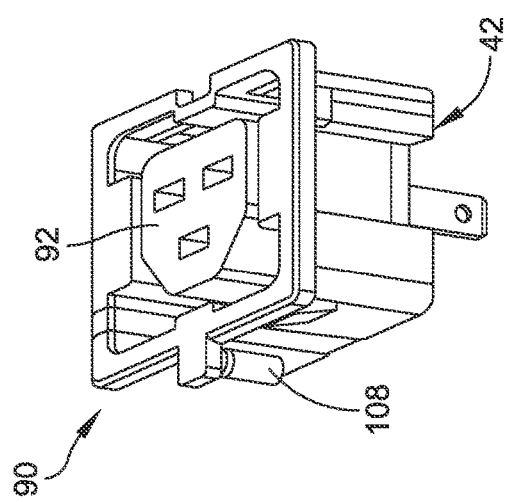
FIGS. 5A and 5B are top and bottom perspective views of an outlet assembly of an embodiment of the present disclosure.
Figure 5B:
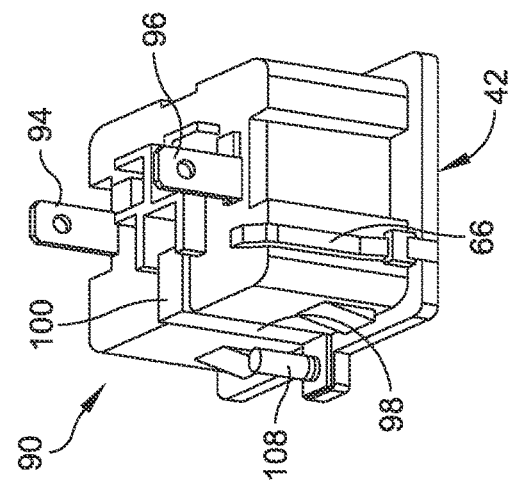

Referring to FIGS. 5A and 5B, which shows an outlet assembly, generally indicated at 90, of another embodiment of the disclosure, the outlet assembly 90 is constructed similarly to outlet assembly 40 and reference numbers used to designate features of outlet assembly 40 are used to designate similar features of outlet assembly 90. The outlet assembly 90 is a C21 outlet, which is configured to receive a C22 plug. The C21 outlet is high temperature variant of a C19 outlet. The outlet assembly 90 includes a molded, plastic rectangular body 42 having a front 44, a back 46, two sides 48, 50 and two ends 50, 52. The front 44 of the outlet body 42 includes one outlet receptacle 92. Sides 48, 50 of the outlet body of the outlet assembly each includes two snap-in clips 60 to mount the outlet body to the chassis 32 of the rPDU 30. Side 50 of the outlet body 42 of the outlet assembly 40 includes a tab 62 that extends horizontally from the side of the outlet body along a plane parallel to a plane of the front 44 of the outlet body. One end 52 of the outlet body 42 of the outlet assembly 40 further includes a feature 64 to receive a snap-in light pipe 66. The outlet assembly 90 further includes a neutral terminal 94 and a single live terminal 96 that each extends from the back 46 of the outlet body 42. The neutral terminal 94 is positioned adjacent one end of the outlet body 42 and the live terminal 96 is positioned adjacent an opposite end of the outlet body. The side 50 of the outlet body 42 includes a feature 98 to receive a ground terminal 100, which is configured to engage the chassis 32 of the rPDU 30 when the outlet body of the outlet assembly is installed in the chassis. The ground terminal 100 is generally S-shaped in construction having a first leg that runs along the side of the outlet body 42 of the outlet assembly within the feature 98, a second smaller leg that runs along a portion of the back 46 of the outlet body, and a third smaller leg that runs along an underside of the tab 62.

The ground terminal 100 includes a threaded portion 108 that is used to secure the outlet assembly 40 to the chassis 32 of the rPDU 30.

Figure 6A:
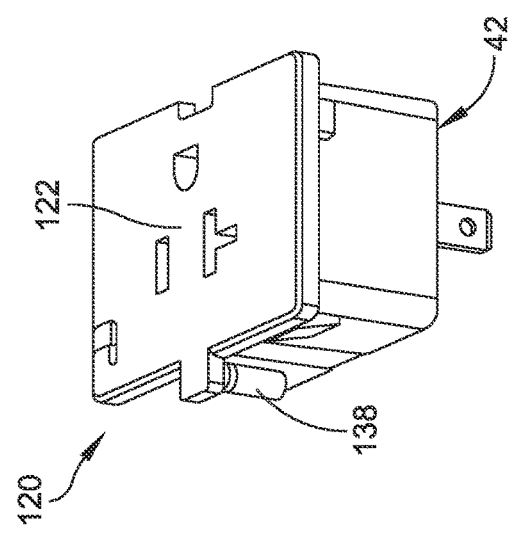
FIGS. 6A and 6B are top and bottom perspective views of an outlet assembly of an embodiment of the present.
Figure 6B:
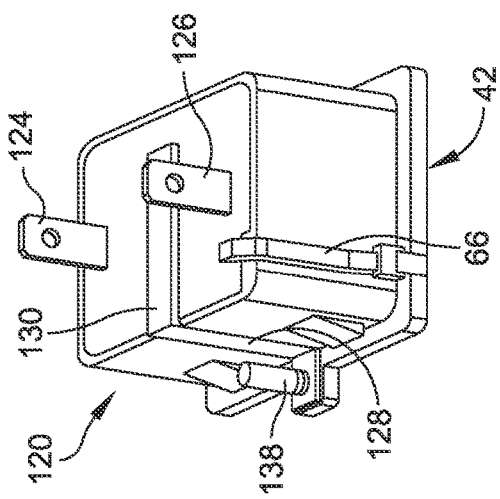

Referring to FIGS. 6A and 6B, which shows an outlet assembly, generally indicated at 120, of another embodiment of the disclosure, the outlet assembly 120 is constructed similarly to outlet assemblies 40, 90 and reference numbers used to designate features of outlet assemblies 40, 90 are used to designate similar features of outlet assembly 120. The outlet assembly 120 is a 5-20R receptacle, which is configured to receive a 5-20P plug. The outlet assembly 120 includes a molded, plastic rectangular body 42 having a front 44, a back 46, two sides 48, 50 and two ends 52, 54. The front 44 of the outlet body 42 includes one outlet receptacle 122 formed in the front of the outlet body. Sides 48, 50 of the outlet body 42 of the outlet assembly 120 each includes two snap-in clips 60 to mount the outlet body to the chassis 32 of the rPDU 30. Side 50 of the outlet body 42 of the outlet assembly 120 includes a tab 62 that extends horizontally from the side of the outlet body along a plane parallel to a plane of the front 44 of the outlet body. One end 52 of the outlet body 42 of the outlet assembly 120 further includes a feature 64 to receive a snap-in light pipe 66. The outlet assembly 120 further includes a neutral terminal 124 and a single live terminal 126 that each extends from the back 46 of the outlet body 42. The neutral terminal 124 is positioned adjacent one end of the outlet body 42 and the live terminal 126 is positioned adjacent an opposite end of the outlet body. The side 50 of the outlet body 42 includes a feature 128 to receive a ground terminal 130, which is configured to engage the chassis 32 of the rPDU 30 when the outlet body of the outlet assembly 120 is installed in the chassis. The ground terminal 130 is generally S-shaped in construction having a first leg that runs along the side 50 of the outlet body 43 of the outlet assembly 120 within the feature 128, a second leg that runs along a back 46 of the outlet body, and a third smaller leg that runs along an underside of the tab 62. As shown, the second leg extends to nearly the opposite side 48 of the outlet body 42 of the outlet assembly 120 so that an end of the leg is disposed under the location of a ground of a plug when installed in the outlet receptacle 122. The ground terminal 130 includes a threaded portion 138 that is used to secure the outlet assembly 120 to the chassis 32 of the rPDU 30.

Each outlet assembly 40, 90, 120 is configured to have the same body size and snap-in clips 60 so that any outlet assembly configuration can be installed into any chassis of an rPDU outlet location. Dual C15, C21 and 5-20R outlets share the same three terminal tab locations and heights. C15 has one additional line terminal tab, but does not effect the overall size and shape of the outlet body. Each outlet assembly 40, 90, 120 further may include pre-installed light pipes 66, which are located in the same positions regardless of the configuration. The position of the light pipe 66 allows any outlet to share the same light emitting diode (LED) light source on the outlet PCB. Each outlet assembly 40, 90, 120 includes a ground terminal or tab that makes direct contact with the chassis of the rPDU.

Referring to FIGS. 7-7C, the outlet assembly 40 shown in FIGS. 3, 4A and 4B is shown in greater detail to illustrate the construction of the light pipe 66. As shown, the light pipe 66 includes an elongate element 150 that travels along the end 52 of the outlet body 42 of the outlet assembly 40 within the feature 64. The light pipe 66 further includes a hook element 152 provided at a top of the elongate element 150. The hook element 152 is configured to wrap around a hook retention feature 154 of the outlet body 42 to enable the light pipe 66 to snap in place when installed on the outlet body 42. The light pipe 66 further includes a bent element 156 provided at a bottom of the elongate element 150. The bent element 156 is configured to be located over an LED of the chassis 32 when installing the outlet assembly 40 in the chassis 32 of the rPDU 30. As described above, the light pipe 66 can be made from clear plastic or glass to enable light from the LED to travel through the light pipe to illuminate the top of the outlet assembly.

Referring to FIGS. 8-8B, the installation of an outlet assembly, e.g., outlet assembly 40, to the chassis 32 of the rPDU 30 will be described in greater detail. It should be understood that outlet assemblies 90 and 120 are installed in an identical manner. As shown, the chassis 32 of the rPDU 30 includes a front wall 160 and side walls 162, 164. The chassis 32 is configured to have an open back. The front wall 160 of the chassis 32 includes several identical outlet cutouts, each indicated at 166, which are each configured to receive the outlet assembly 40 as described herein. In the shown embodiments, there are three outlet cutouts having respective outlet assemblies 40 installed therein, one outlet cutout having outlet assembly 90 installed therein, and four outlet cutouts 166 are shown in an empty configuration. Each outlet cutout 166 is generally rectangular in construction and sized to receive the back 46 of the body 42 of the outlet assembly 40 when installing the outlet assembly to the chassis 32. The front wall 160 of the chassis 32 further includes several small openings, each indicated at 168, one for each cutout 166, which are positioned adjacent a respective outlet cutout. The purpose of the small openings 168 will be described in greater detail below when describing the installation of the outlet assembly 40 to the chassis 32.

As mentioned above, each outlet assembly 40 includes the four snap-in clips 60, which are designed to engage opposite edges of the outlet cutout 166 to mount the outlet body 42 to the chassis 32 of the rPDU 30. The arrangement is such that the back 46 of the outlet body 42 of the outlet assembly 40 is inserted within the outlet cutout 166 until the flange 56 of the front 44 engages the chassis 32 of the rPDU 30, with the snap-in clips 60 being forced inboard by the opposite edges of the outlet cutout 166. Once cleared, the snap-in clips 60 engage the backside of the front wall 160 of the chassis to partially secure the body 42 of the outlet assembly 40 to the chassis 32. To remove the outlet assembly 40, the snap-in clips 60 are moved inboard to disengage the front 44 thereby enabling the outlet body 42 of the outlet assembly to be removed through the outlet cutout 166.

The rPDU further includes a circuit breaker 170, which is secured to the chassis 32 to cover the open back of the chassis, and two printed circuit boards (PCBs) 172, 174, which are stacked on each other and secured to the outlet assemblies 40. The printed circuit board 172 closest to the chassis 32 includes several LEDs, each indicated at 176. As described herein, the LEDs 176 are positioned adjacent the bent elements 156 of the light pipes 66 of the outlet assemblies 40 to provide light to the light pipes. Although LEDs 176 are shown and described herein, other light sources may be employed to provide light to the light pipes 66. When installed, the bent element 156 of each light pipe 66 is positioned above the circuit board 172 thereby enabling light generated by the LED 176 to emit light to through the light pipe. Although each outlet assembly 40 includes a single light pipe 66, the outlet assembly can be configured with more than one light pipe, e.g., one for each outlet receptacle when the outlet assembly is configured with two outlet receptacles.

Referring to FIGS. 9 and 9A, the printed circuit board 172 includes several Faston® connectors provided by Tyco Electronics Services GmbH, each indicated at 178, which extend from one side of the printed circuit board. The Faston® connectors 178 provide a quick and easy connection between the printed circuit board 172 and the neutral terminal 68 and the live terminals 70, 72 of the outlet assembly 40. As shown, the Faston® connectors 178 are positioned on the printed circuit board 172 at locations to make the connections with their respective neutral terminal 68 and live terminals 70, 72. In one embodiment, the printed circuit board 172 is installed on the chassis 32 of the rPDU 30 after the outlet assemblies 40 are installed in the chassis. The opposite side of the printed circuit board can be configured to include several electrical tabs which are provided to connect (electrical and mechanical) to the other printed circuit board 174. The positioning of the Faston® connectors 178 depends on the configuration of the outlet assembly 40, 90, 120. For example, the number (three) and positioning of the Faston® connectors 178 used to connect the outlet assembly 40 shown in FIGS. 4A and 4B are different than the number (two) and positioning of the Faston® connectors 178 used to connect the outlet assemblies 90, 120 shown in FIGS. 5A and 5B and FIGS. 6A and 6B, respectively. The printed circuit board 172 shown in FIG. 9A is configured to be electrically and mechanically secured to the outlet assembly 40 shown in FIGS. 4A and 4B.

In some embodiments, the outlet electrical tabs or terminals may be of varied length. For example, shorter tabs can be provided to communicate to the nearest PCB and its Faston® connectors, and longer tabs can be provided to communicate to more distant PCB(s) and their Faston® connectors. Further, longer electrical tabs may communicate with more than a single PCB. Further, longer electrical tabs may communicate with wires, terminated with Faston® connectors, while still in communication with PCB-based Faston® connectors. In one example, one terminal, e.g., a neutral terminal, may be configured to extend a first, shorter length to a near PCB, and another terminal, e.g., a live terminal, may be configured to extend a second, longer length to a more distant PCB.

Figure 10:
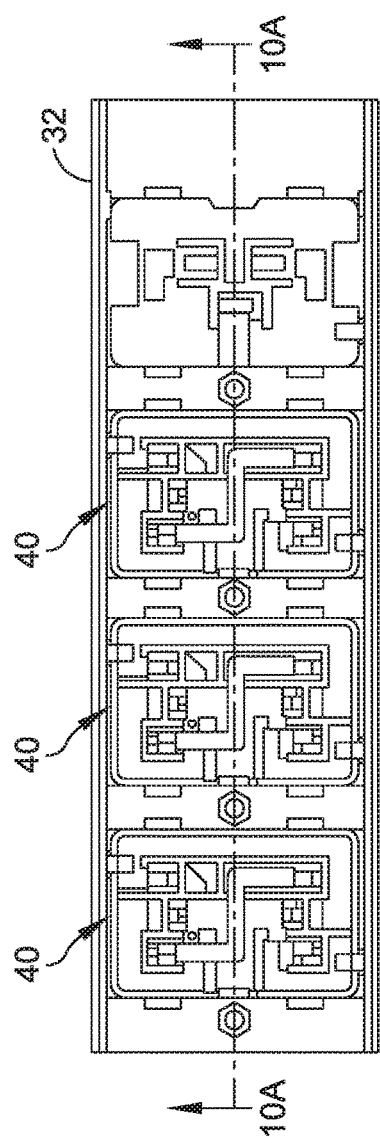
FIG. 10 is a bottom plan view of a portion of the rPDU configured to receive outlet assemblies of the present disclosure.
Figure 10A:
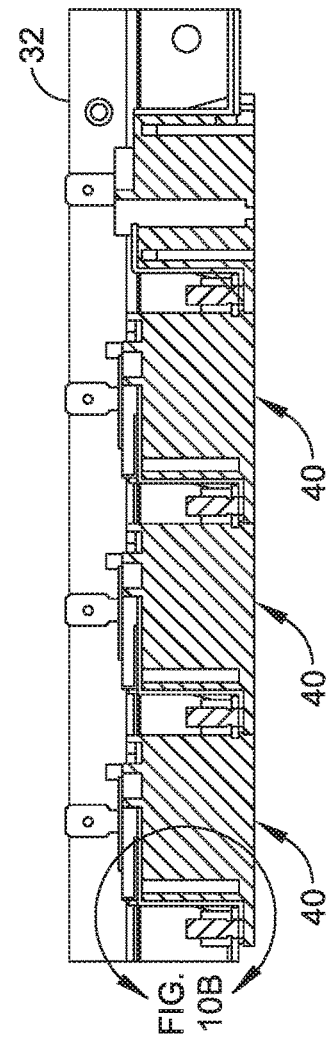
FIG. 10A is a cross-sectional view of the portion of the rPDU taken along line 10A-10A of FIG. 10.
Figure 10B:
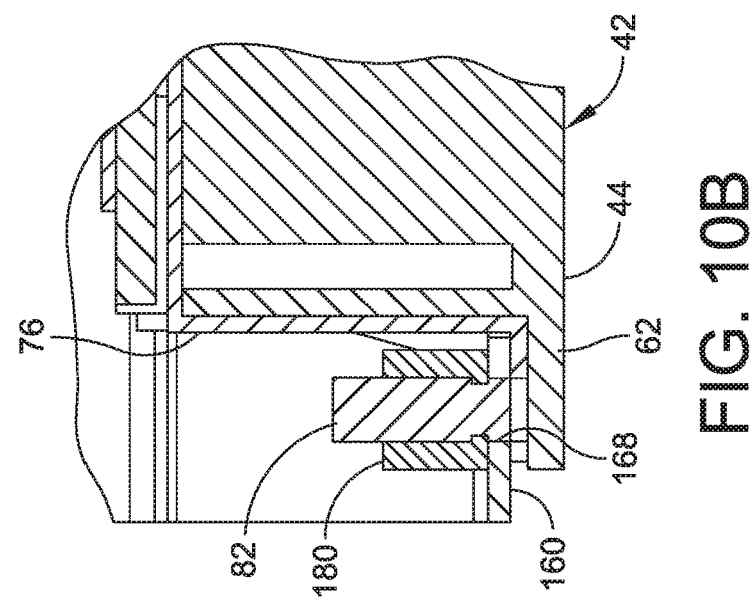
FIG. 10B is an enlarged detail view of a portion of the rPDU showing chassis grounding of an outlet assembly.

Referring to FIGS. 10-10B, the securement of an outlet assembly, e.g., outlet assembly 40, to the chassis 32 of the rPDU 30 is shown in greater detail. As shown, each outlet assembly 40 is received within its respective outlet cutout 166 in the front wall 160 of the chassis 32. Regardless of the type of outlet receptacle presented by the outlet assembly, the outlet assembly is capable of being inserted into the outlet cutout 166 provided in the chassis 32. As mentioned above, for outlet assembly 40, the front wall 160 of the chassis 32 includes several small openings 168, one for each outlet cutout 166, which are each configured to receive the threaded portion 82 of the ground terminal 76 therethrough so that the threaded portion extends through the small opening. Once the outlet body 42 of the outlet assembly 40 is positioned within the outlet cutout 166 so that the outer flange 56 engages the front wall 160 of the chassis 32, the threaded portion 82 is secured in place by a threaded nut 180, which is threaded onto the threaded portion to secure the outlet body 42 of the outlet assembly 40 to the chassis 32 and to carry earth ground from the outlet body to the chassis. Together the threaded portion 82 of the ground terminal 76 and the threaded nut 180 are referred to as a "fastener" that is used to secure the outlet body 42 of the outlet assembly 40 to the chassis 32 and to carry earth ground. In embodiments, another type of fastener may be used. Thus, the outlet body 42 is securely held in place by the chassis 32 within the outlet cutout 166 by the snap-in clips 60 and grounded by the threaded nut 180. Outlet assemblies 90, 120 are secured to the chassis 32 in a similar manner.

Thus, it should be observed that multiple electrical outlets are configured to fit in identical outlet cutouts provided in a chassis of an rPDU. The outlet assemblies enable a combination of different types of outlet receptacles on the same chassis of the rPDU and outlet PCB. These outlet receptacles can be configured to include dual C15, single C21 and single 5-20R. This concept can be applied to other outlet receptacles, such as dual C13, dual 5-15R and single C19, etc.

The outlet assemblies of embodiments of the present disclosure have the same outer body size and mounting clips. The outlet assemblies also have common locations for terminal tabs and snap-in light pipes to allow the use of same outlet PCB for different outlet types. The ground tab design enables the outlet receptacles to be directly grounded to the metal chassis.

The electrical outlet assemblies of embodiments of the present disclosure allow flexible combinations of different types of outlets in a common rPDU chassis. This construction simplifies manufacturing processes and customization requirements. Customization is a fast-growing trend in the rPDU market, and the outlet assemblies and chassis design enable quick and easy customization.

The outlets also increase the outlet counts in a rPDU. Currently, a typical single wide switched rPDU uses single row outlet arrangement to get 24 outlets. The outlets allow 24 to 48 outlets in a similar chassis by using the new outlets.

In some embodiments, each outlet assembly includes the same outer body size and snap-in clips to enable the outlet assembly to be installed into identical outlet cutouts provided on the chassis of the rPDU.

In some embodiments, each outlet assembly includes common terminal locations and sizes so the terminals can be engaged by the Faston® connectors on the same outlet PCB.

In some embodiments, each outlet assembly includes the same light pipes and light locations so the outlet assembly can use the same LED light sources on the same outlet PCB.

In some embodiments, the light pipe is made of clear plastic material.

In some embodiments, the light pipes are designed to be part of the outlet walls and can be easily pre-installed using the snap-in feature. If no light pipes are required for the rPDU, the light pipe can be fabricated from the same material as the body of the outlet assembly.

In some embodiments, each outlet assembly includes the ground tab designed so that the outlet assembly is directly grounded to the metal chassis to simplify the outlet PCB design and rPDU manufacturing. The metal ground tab can be fabricated from copper, for example.

In some embodiments, each outlet assembly can be installed to the rPDU with no special operations by a snap-in operation. The outlet PCB is then installed to the rPDU so that the PCB engages with the outlet contact terminals (e.g., with Faston® connectors).

In some embodiments, the body of the outlet assembly can be fabricated from Underwriters Laboratories (UL)-approved Nylon 6 material, is filled approximately 20% with glass, and has a V-2 flammability rating or other thermoplastics with a V-0 flammability rating. The physical profile of the outlet assembly can be constructed to fit into a corresponding outlet cutout provided in the chassis.

In some embodiments, the outlet assemblies may be IEC320-C13 or IEC320-C19 outlets.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A rack power distribution unit comprising:
a chassis including a chassis front and a chassis back, the chassis front having at least one outlet cutout formed therein;
at least one outlet assembly within the at least one outlet cutout, the at least one outlet assembly including a body having a body front and a body back, the body front having an outer flange and at least one outlet receptacle, the body back being configured to be inserted within the at least one outlet cutout, the at least one outlet assembly further including a neutral terminal, at least one live terminal, and a ground, the at least one outlet assembly further including a fastener configured to secure the at least one outlet assembly to the chassis; and
at least one printed circuit board configured to the be secured to the chassis, the at least one printed circuit board including at least one first connector configured to connect to the neutral terminal and at least one second connector configured to connect to the at least one live terminal.

2. The rack power distribution unit of claim 1, wherein the ground includes a ground terminal, the ground terminal being positioned along a side of the body of the at least one outlet assembly.

3. The rack power distribution unit of claim 2, wherein the fastener includes a threaded portion forming part of the ground terminal and a threaded nut configured to be threadably received by the threaded portion.

4. The rack power distribution unit of claim 3, wherein the at least one outlet cutout includes a plurality of outlet cutouts, each of the outlet cutouts having a shape and size identical to at least another of the outlet cutouts.

5. The rack power distribution unit of claim 4, wherein the chassis further includes a plurality of openings, one of the openings for each of the outlet cutouts with the one of the openings being positioned adjacent a respective one of the outlet cutouts and configured to receive the fastener.

6. The rack power distribution unit of claim 3, wherein the body of the at least one outlet assembly further includes a tab that extends horizontally from a side of the body along a plane parallel to a plane of the body front, the tab being configured to conceal the ground terminal.

7. The rack power distribution unit of claim 1, wherein the printed circuit board includes at least one LED, and wherein the at least one outlet assembly further includes a light pipe secured to the body of the at least one outlet assembly.

8. The rack power distribution unit of claim 7, wherein the light pipe includes an elongate element that travels along an end of the body of the outlet assembly and a hook element provided at a top of the elongate element, the hook element being configured to wrap around a hook retention feature of the body to enable the light pipe to snap in place when installed on the body of the at least one outlet assembly.

9. The rack power distribution unit of claim 8, wherein the light pipe further includes a bent element provided at a bottom of the elongate element, the bent element being configured to be located over one of the at least one LED of the chassis when installing the at least one outlet assembly in the chassis.

10. The rack power distribution unit of claim 1, wherein the body of the at least one outlet assembly further includes at least one snap-in clip, which is configured to releasably engage an edge of the at least one outlet cutout to mount the body to the chassis.

11. The rack power distribution unit of claim 1, wherein the at least one outlet assembly comprises at least one of a C13 outlet, a C15 outlet, a C19 outlet, a C21 outlet, or a 5-20R outlet.

12. The rack power distribution unit of claim 1, wherein one of the neutral terminal and the at least one live terminal is configured to extend a first length and the other of the neutral terminal and the at least one live terminal is configured to extend a second length.

13. A rack power distribution unit comprising:
a chassis including a chassis front and a chassis back, the chassis front having at least one outlet cutout formed therein;
at least one outlet assembly within the at least one outlet cutout, the at least one outlet assembly including a body having a body front and a body back, the body front having an outer flange and at least one outlet receptacle, the back of the body being configured to be inserted within the at least one outlet cutout, the at least one outlet assembly further including a neutral terminal, at least one live terminal, and a ground;
at least one printed circuit board configured to the be secured to the chassis, the at least one printed circuit board including at least one first connector configured to connect to the neutral terminal and at least one second connector configured to connect to the at least one live terminal, the at least one printed circuit board further including at least one LED; and
a light pipe secured to the body of the at least one outlet assembly and positioned over the at least one LED so that light generated by the at least one LED travels through the light pipe.

14. The rack power distribution unit of claim 13, wherein the light pipe includes an elongate element that travels along an end of the body of the at least one outlet assembly and a hook element provided at a top of the elongate element, the hook element being configured to wrap around a hook retention feature of the body to enable the light pipe to snap in place when installed on the body of the at least one outlet assembly.

15. The rack power distribution unit of claim 14, wherein the light pipe further includes a bent element provided at a bottom of the elongate element, the bent element being configured to be located over an LED of the chassis when installing the at least one outlet assembly in the chassis.

16. The rack power distribution unit of claim 13, wherein the light pipe is made from clear plastic or glass to enable light from the LED to travel through the light pipe to illuminate the top of the at least one outlet assembly.

17. The rack power distribution unit of claim 13, wherein the at least one outlet assembly comprises at least one of a C13 outlet, a C15 outlet, a C19 outlet, a C21 outlet, or a 5-20R outlet.

18. A rack power distribution unit comprising:
a chassis including a chassis front and a chassis back, the chassis front having at least one outlet cutout formed therein;

at least one outlet assembly within the at least one outlet cutout, the at least one outlet assembly including a body having a body front and a body back, the body front having an outer flange and at least one outlet receptacle, the body back being configured to be inserted within the at least one outlet cutout, the at least one outlet assembly further including a neutral terminal, at least one live terminal, and a ground terminal, the ground terminal being positioned along a side of the body of the at least one outlet assembly, the ground terminal including a threaded portion configured to be inserted into an opening of the chassis and secured by a threaded nut, and the body of the at least one outlet assembly further including at least one snap-in clip configured to releasably engage an edge of the outlet cutout to mount the body to the chassis; and at least one printed circuit board configured to the be secured to the chassis, the at least one printed circuit board including at least one first connector configured to connect to the neutral terminal and at least one second connector configured to connect to the at least one live terminal.

19. The rack power distribution unit of claim 18, wherein the body of the at least one outlet assembly further includes a tab that extends horizontally from a side of the body along a plane parallel to a plane of the body front, the tab being configured to conceal the ground terminal.

\* \* \* \* \*